(12) United States Patent
Satake et al.

(10) Patent No.: US 6,246,216 B1
(45) Date of Patent: Jun. 12, 2001

(54) BATTERY CHARGE CONTROL DEVICE HAVING FUNCTION TO DECIDE GASSING WITHOUT TEMPERATURE SENSOR

(75) Inventors: Syuji Satake; Hisashi Takemoto, both of Shizuoka-ken (JP)

(73) Assignee: Yazaki Corporation, Tokyo (JP)

( * ) Notice: Subject to any disclaimer, the term of this patent is extended or adjusted under 35 U.S.C. 154(b) by 0 days.

(21) Appl. No.: 09/609,411

(22) Filed: Jul. 3, 2000

(30) Foreign Application Priority Data

Jul. 2, 1999 (JP) ............................................. P11-189390

(51) Int. Cl.[7] ....................................................... H02J 7/04
(52) U.S. Cl. ............................................. 320/147; 320/137
(58) Field of Search ................................... 320/147, 137, 320/1; 429/96, 97, 98, 99

(56) References Cited

U.S. PATENT DOCUMENTS

| 5,589,757 | * | 12/1996 | Klang ..................................... 320/160 |
| 5,701,068 | * | 12/1997 | Baer et al. ............................ 320/119 |
| 5,808,443 | * | 9/1998 | Lundstrom ........................... 320/147 |

FOREIGN PATENT DOCUMENTS 8-278352    10/1996  (JP) .

* cited by examiner

Primary Examiner—Peter S. Wong
Assistant Examiner—Lawrence Luk
(74) Attorney, Agent, or Firm—Finnegan, Henderson, Farabow, Garrett & Dunner, L.L.P.

(57) ABSTRACT

A battery charge control device is capable of detecting a gassing state in a battery without using a temperature sensor. Under condition of charging the battery 5 with a charging current, when a terminal voltage Vi of the battery 5 monitored by the device exceeds a threshold value, a temporary-gassing detecting unit 23 informs a voltage regulation calculating unit 24 that the battery 5 is in course of reaching its gassing state. The voltage regulation calculating unit 24 calculates a changing rate of terminal voltage Vi of the battery 5 while it is in course of reaching the gassing state. When the calculated changing rate exceeds a preset decision value, a gassing detecting unit 25 judges that the battery 5 has just reached the gassing state. A decision value renewing unit 27 changes the decision value corresponding to the charging current.

6 Claims, 4 Drawing Sheets

BATTERY CHARGE CONTROL DEVICE HAVING FUNCTION TO DECIDE GASSING WITHOUT TEMPERATURE SENSOR

BACKGROUND OF THE INVENTION

1. Field of the Invention

The present invention relates to a battery charge control device which has a "gassing" deciding function to detect an occurrence of the gassing state caused in a battery on a vehicle at the vehicle's traveling, without using a temperature sensor and with ease and accuracy.

2. Description of Related Art

Under general condition that the battery is being charged, if its terminal voltage exceeds a stated voltage, then the battery begins to generate gas (e.g. oxygen gas, hydrogen gas) due to the electrolysis of water contained in the battery. Note that the terminal voltage at the time of beginning to generate such the gas is normally referred to as "gassing voltage". As the function of temperature of the electrolyte (liquid) in the battery, the gassing voltage Vgs can be obtained by the following formula of:

$$Vgs=\alpha-\beta(T-20° C.) \tag{1}$$

wherein $\alpha$, $\beta$ are the battery's intrinsic constants; and

T is the temperature of the electrolyte.

Especially in the "hybrid" vehicle equipped with a plurality of power sources, such as an engine and an alternator, a great deal of regenerative energy (electric power) during the vehicle's traveling is charged into the battery one after another. Under the situation, it is remarkably important to detect whether or when the terminal voltage of the battery is reaching the above gassing voltage Vgs in view of preventing the deterioration of battery.

In order to acknowledge the terminal voltage's reaching the gassing voltage Vgs, for example, there is a known system where the battery is equipped with the temperature sensor.

In this system employing the temperature sensor in order to detect the reach for the gassing voltage Vgs, it is executed to calculate it on the basis of a temperature informed by the temperature sensor, in accordance with the above formula (1). Also in the system, when the terminal voltage of the battery reaches the gassing voltage Vgs, it is executed to switch the present charging current into a new charging current prepared for the next stage (i.e. a new current smaller than the current) in view of restricting the generation of gas in the electrolyte.

In the above-mentioned system, however, there exists a problem that the embodied apparatus is high-priced because of the installation of the temperature sensor. Additionally, in order to calculate the gassing voltage Vgs as the function of temperature, the calculation program installed on the apparatus is complicated.

Note that it is desirable to position the temperature sensor in the electrolyte (liquid) in view of detecting the temperature of the electrolyte in the battery precisely. Nevertheless, in the present circumstances, it is impossible to dip the temperature sensor in the electrolyte.

Since, in actuality, the temperature sensor is arranged in the vicinity of the battery or pasted on a sidewall of the battery, there is a difference between the actual temperature of the electrolyte and the temperature information provided by the temperature sensor.

Additionally, it is unavoidable that the temperature of air outside affects the so-positioned temperature sensor.

Thus, the gassing voltage Vgs based on the temperature information provided by the temperature sensor has a reduced reliability in its accuracy due to the above difference between the actual temperature of the electrolyte and the temperature detected by the temperature sensor.

In summary, the conventional system has drawbacks that the gassing cannot be detected despite that the terminal voltage of the battery has already reached the gassing voltage during the vehicle's traveling, and vice versa (erroneous detection of the gassing despite that the battery voltage has not reach the gassing voltage yet). Such the drawbacks cause either surplus or shortage of the charged energy in charging the battery.

SUMMARY OF THE INVENTION

Under the circumstances, it is therefore an object of the present invention to provide a battery charge control device that is capable of easy detection of a time when the battery actually reaches its gassing state, without using the temperature sensor.

The object of the present invention described above can be accomplished by a battery charge control device for controlling to charge a battery electrically connected with a load. The battery charge control device is constructed so as to charge the battery while lowering a charging current brought from the load in a step manner when the battery's residual capacity drops during the load's operation. The battery charge control device comprises a memory unit for collecting and storing a sequential data of terminal voltage of the battery, a temporary-gassing detecting unit connected to the memory unit, a voltage regulation calculating unit connected to the temporary gassing detecting unit and a gassing detecting unit connected to the voltage regulation calculating unit.

In operation, when the so-collected terminal voltage of the battery exceeds a threshold value during charging the battery with a charging current, the temporary-gassing detecting unit generates a signal representing that the battery is in course of reaching its gassing state.

The voltage regulation-calculating unit calculates a changing rate (i.e. voltage regulation) of terminal voltage of the battery while the battery is in course of reaching the gassing state.

When the calculated changing rate exceeds a preset decision value for the changing rate, the gassing detecting unit judges that the battery has just reached the gassing state.

Therefore, without using the temperature sensor, it is possible to judge the gassing state in the battery during the vehicle's traveling, with high accuracy.

The battery charge control device further includes a charging current switching unit which allows the battery to be charged with a designated charging current corresponding to the beginning of charging and a decision value renewing unit. In operation, the charging current switching unit further switches the designated charging current to a next lower charging current as soon as the gassing state of the battery has been detected. Whenever the charging current is switched, the decision value renewing unit changes the preset decision value for the changing rate to a new decision value for the changing rate of the voltage corresponding to the so-switched charging current.

Even after changing the present charging current into a lower one at the battery's reaching the gassing state in order to restrict the occurrence of gassing, the subsequent charging again causes the temperature of the battery to be increased thereby varying the battery voltage abruptly.

According to the invention, since the device is adapted so as to also renew the decision value corresponding to the so-changed charging current, it is possible to detect the gassing state occurring after the charging current has been changed with high accuracy.

These and other objects and features of the present invention will become more fully apparent from the following description and appended claims taken in conjunction with the accompany drawings.

DESCRIPTION OF THE PREFERRED EMBODIMENT

An embodiment of the present invention will be described with reference to the drawings.

Figure 1:
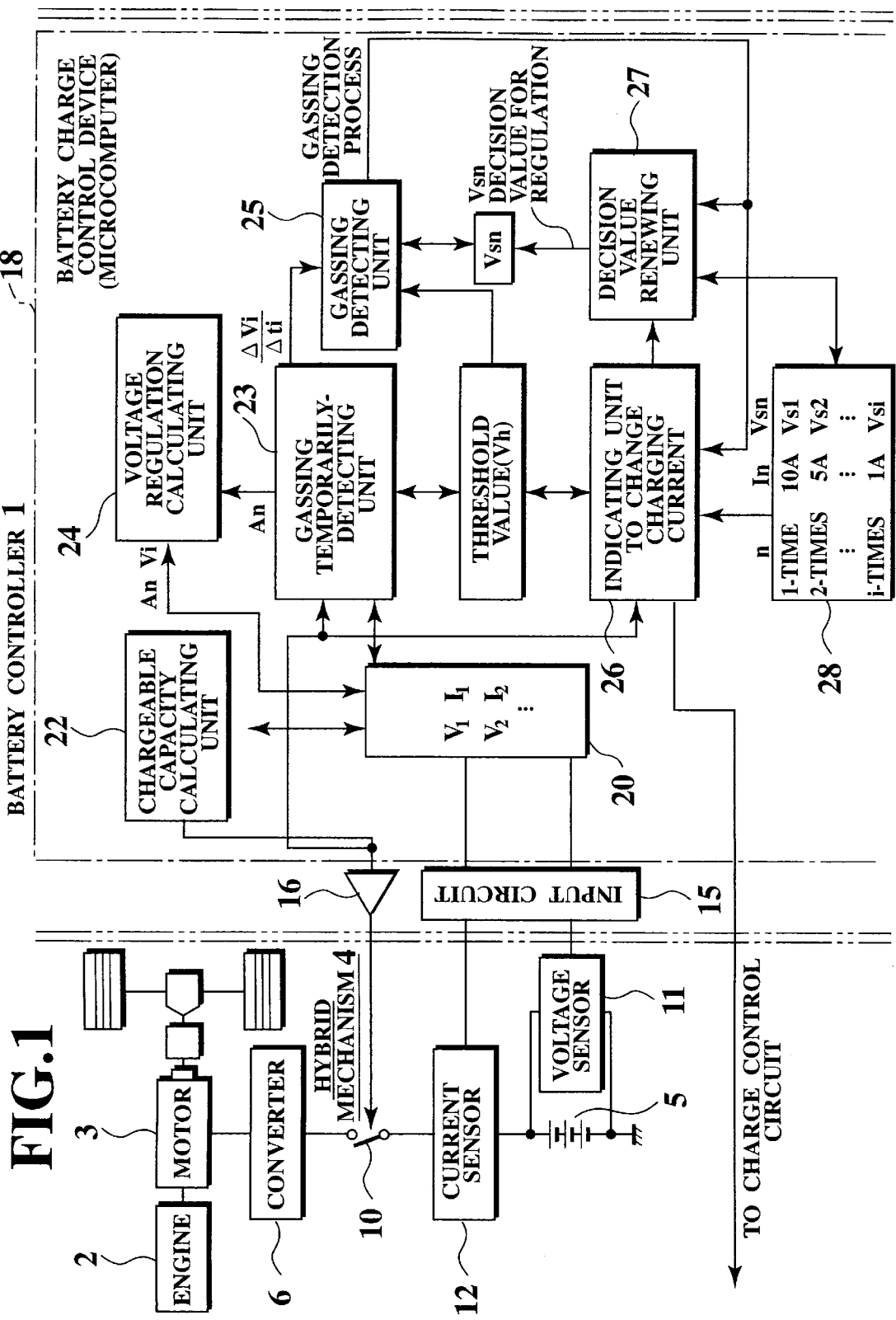
FIG. 1 is a schematically structural view of the battery charge control device in accordance with an embodiment of the invention.

FIG. 1 is a schematically structural view of the battery charge control device of the embodiment of the invention. In FIG. 1, a shown battery controller 1 is provided for a hybrid vehicle having an engine 2 and a motor (or an alternator) 3 as powers units thereof. The engine 2 and the motor 4 constitute a so-called "hybrid" mechanism 4 in the vehicle. In operation, the battery controller 1 detects the gassing voltage of a battery 5 without requiring a temperature sensor.

A converter 6 serves to control both charging power and discharging power between the motor 3 and the battery 5.

A voltage sensor 11 is connected in parallel with the battery 5. A relay switch 10 is disposed between the battery 5 and the converter 6. Between the relay switch 10 and the battery 5, a current sensor 12 is connected to the battery 5 in series.

The battery controller 1 includes an input circuit 15 by which a voltage detected by the voltage sensor 11 is shaped into a designated signal in waveform, a buffer 16 for amplifying a relay control signal for activating or inactivating the relay switch 10 and a battery charge control device (microcomputer) 18. In operation, the battery-capacity measuring device 18 calculates a chargeable capacity of the battery 5 on the ground of a voltage Vi for a predetermined period since the relay switch 10 has been being inactivated. The device 18 further detects the gassing voltage thereby to alter the charging current in a step manner and estimates the full-chargeable capacity at that time upon the adoption of the gassing voltage and a temperature.

As shown in FIG. 1, the battery charge control device 18 comprises a memory 20 for storing both voltage V and current I, a chargeable capacity calculating unit 22, a temporary gassing detecting unit 23, a voltage regulation (changing rate) calculating unit 24, a gassing detecting unit 25, a charging current switching unit 26, a decision value renewing unit 27 and a memory 28 for storing the number of changing n, the changed currents $I_N$ and the decision voltages $V_{SN}$ for the gassing voltage.

The chargeable capacity calculating unit 22 outputs a relay-off signal to the relay switch 10 through the buffer 16 at regular intervals of time ti (100 m sec) thereby to stop the charging operation and extracts the maximum voltage Vg from voltage Vi collected within the predetermined period, the voltage Vg being also lower than the chargeable voltage (e.g. 42V) of the converter 6.

Next, it is executed to read the voltage Vi of the battery 5 within the predetermined period ti and calculate respective ranging rates ΔE' of a function VY at plural voltages within a range from the voltage Vg to the smallest voltage (e.g. 100V) thereby to obtain a gathering point of the changing rates ΔE' of the voltage just after stopping the charging operation (e.g. calculation under the establishment of about 1 hour as the gathering time th). That is, it is executed to estimate the actual voltage E of the battery 5 upon elimination of a difference ΔE in voltage between both poles of the battery 5 just after the stop of charging.

Then, by employing the above balanced voltage E, the present chargeable capacity of the battery 5 is calculated by the following formula (2):

$$\text{Chargeable Capacity} = (V_S^2 - E^2)/(V_S^2 - V_e^2) \qquad (2)$$

wherein $V_S$ is a full-chargeable voltage;

$V_e$ is an ending voltage for discharging; and

E is a balanced voltage.

The temporary-gassing detecting unit 23 monitors the voltage V collected into the memory 20 at charging and judges whether the voltage V exceeds a preset threshold value Vh. If the collected voltage V exceeds the threshold value Vh, then the unit 23 informs the voltage regulation (changing rate) calculating unit 24 that the battery 5 is in course of reaching the gassing voltage Vgs. In other words, the device 18 is now detecting the temporary-gassing state of the battery 5. At the same time, it is also executed to inform the unit 24 of the collection number $A_N$ of the collected voltage Vi exceeding the threshold value Vh.

While being informed that the battery 5 is in course of reaching the gassing voltage Vgs, the voltage regulation calculating unit 24 successively reads the voltage Vi of the collection number $A_N$ memorized in the memory 20 to calculate the changing rate Vi' (Vi'=Vi/Δt) of the voltage Vi per unit time Δt.

While it is judged that the battery 5 is in course of reaching the gassing voltage Vgs and when the changing rate Vi' (Vi'=Vi/Δt) of the voltage Vi is more than a decision value $V_{SN}$ for the changing rate, the gassing detecting unit 25 informs the charging current switching unit 26 and the decision value renewing unit 27 of the detection of gassing state upon the judgement that the battery 5 is actually under the gassing state at present.

The charging current switching unit 26 changes the charging current In in the memory 28 in a step manner whenever the gassing detecting unit 25 detects the gassing state in the battery 5, and further informs the decision value renewing unit 27 of the charging current In at changing.

Being informed of the detection of gassing state and the current In at changing, the decision value renewing unit 27 operates to renew the present decision value $V_{SN}$ established in the gassing detecting unit 25 into a new value $V_{SN}$ stored in the memory 28 so as to correspond to the above current In at the changing.

That is, according to the embodiment, when the changing rate of voltage Vi exceeds the decision value, it is judged that the battery 5 is actually under the gassing state, so that it is executed to change the charging current for the battery 5 and also the decision value as a threshold value against the changing rate, corresponding to the new charging current after the changing.

The battery charge control device 18 includes a not-shown residual capacity estimating unit. The residual capacity estimating unit averages a plurality of voltage and current data of the battery 5. Then, when a predetermined number of mean data is gathered, the residual capacity estimating unit further calculates its correlation coefficient r of data. If the correlation coefficient r represents an intensive negative correlation, then it is executed to detect a regression line (an approximate line) about the data by the method of least squares. Further, from this approximate line Y (Y=aX+b) and a reference current Io, it is executed to estimate an estimation voltage Vn of the battery 5 at present.

Then, by using the estimation voltage Vn, the full-charging voltage Vs and the preset charging end voltage Ve, the present residual capacity SOC is obtained.

Figure 2:
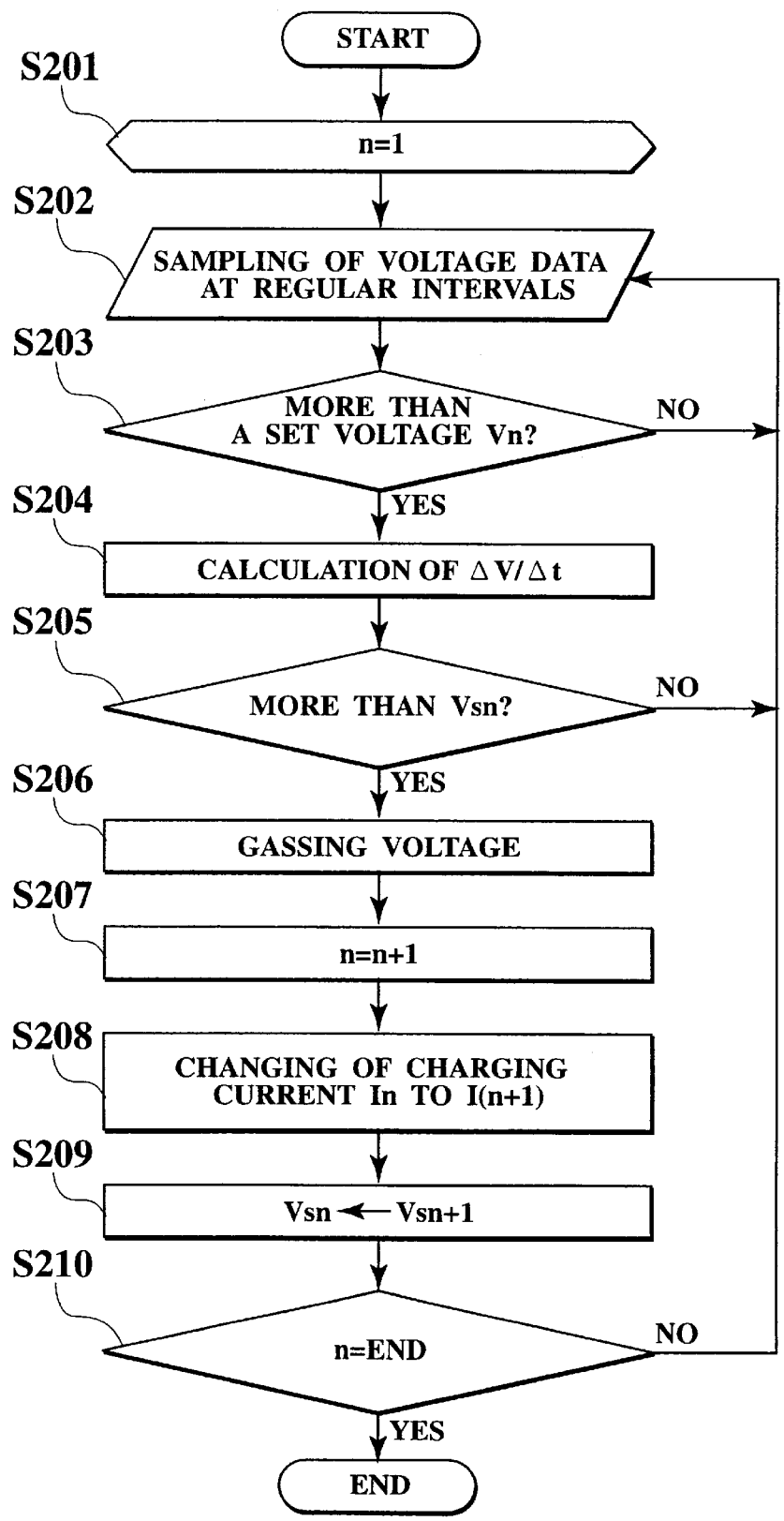
FIG. 2 is a flow chart for explanation of the operation of the device of the embodiment of the invention.

We now describe the operation of the above-constructed battery charge control device with reference to the flow chart of FIG. 2. At first, as the charging operation for the battery 5 starts, the switching unit 26 transmits a command to a charging control circuit (not shown) of the converter 6 (S201). Note that this command corresponds to a signal to cause the converter 6 to charge the battery 5 by a current value $I_1$ (e.g. 10A) at an initial stage (n). Being accompanied with the charging operation based on the above charging current $I_1$, both voltage values V and current values I of the battery 5 are collected. by the memory 20 at intervals of 1 msec.

Next, the temporary gassing detecting unit 23 reads the so-collected data consisting of voltage values V and current values I (S202). At next step S203, it is judged by the unit 23 whether the voltage value V exceeds a preset threshold value Vh or not. If it is judged at step S203 that the voltage value V does not exceed the threshold value Vh, then the routine returns to step S202.

Figure 3:
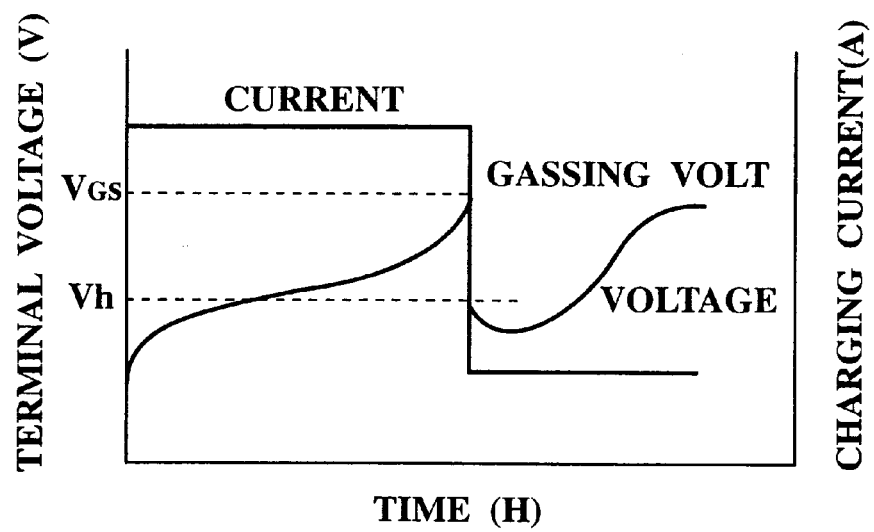
FIG. 3 is an explanatory diagram for explanation of the relationship among a threshold value, a charging current and a gassing voltage.

That is, as shown in FIG. 3, the temporary gassing detecting process executed at step S203 is to judge whether the terminal voltage of the battery 5 exceeds the threshold value Vh (value of voltage) under the condition of flowing a constant current or not.

Generally, when the terminal voltage of the battery 5 gradually rises as it stores the charging current and finally reaches the constant voltage (i.e. the above threshold voltage), subsequently, the rising of the terminal voltage gets moderately. Despite that, if the charging is further maintained, then the temperature of the battery 5 is elevated. Consequently, the voltage V is abruptly elevated thereby to reach the gassing voltage finally.

That is, according to the embodiment, the presence of sign that the terminal voltage may reach the gassing voltage is judged by utilizing the threshold value Vh. Repeatedly, this threshold value Vh is based on the terminal voltage of the battery 5 depending on the rising of temperature accompanied with the charging operation. In other words, the establishment of the threshold value Vh originates in the consideration of the influence of charging operation on the temperature of the battery.

At next step S204, while the unit 23 judges that the temporary gassing is being detected, the voltage regulation (changing rate) calculating unit 24 successively reads the voltage Vi of the collecting number An stored in he memory 20 and calculates the changing rate Vi' of voltage Vi per unit time Δt (Vi'=Vi/Δt).

Under condition of detecting the temporary gassing, the gassing detecting unit 25 judges whether the above changing rate Vi' of voltage Vi (Vi'=Vi/Δt) is more than a judgement value $V_{SN}$ for the changing rate (S205).

At step S205, if it is judged that the changing rate Vi' of voltage Vi is more than a judgement value $V_{SN}$, the routine goes to step S206 where the gassing detecting unit 25 judges that the battery voltage Vi reaches the gassing voltage Vgs.

Figure 4:
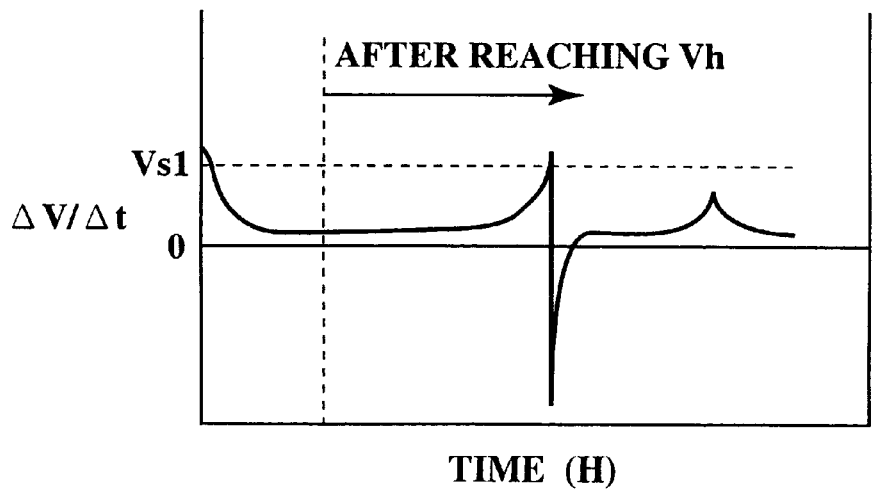
FIG. 4 is an explanatory diagram for explanation of the relationship among a changing rate in voltage (or voltage regulation) at the gassing and a judgment value of the embodiment.
Figure 5:
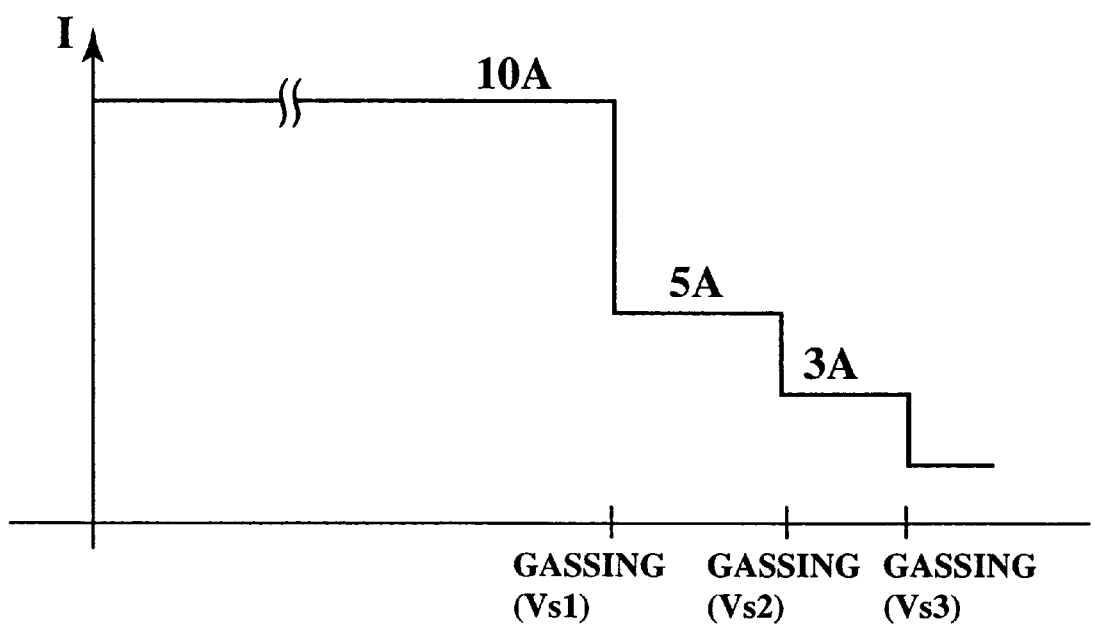
FIG. 5 is an explanatory diagram for explanation of the renewal of a judgement value $V_{SN}$ for the gassing, in the multistage renewal of charge current in accordance with the embodiment of the invention.

From FIG. 4 where the changing rate of voltage Vi exceeding the threshold value Vh is illustrated by a waveform, it will be understood that the changing rate Vi' of voltage Vi (Vi'=Vi/Δt) after the temporary gassing has been detected changes abruptly when the voltage Vi is about to reach the gassing voltage Vgs. According to the embodiment, when the changing rate under the abrupt change exceeds the judgement value $V_{SN}$ for the changing rate ($V_{S1}$ at 10A), it is judged that the real gassing has just occurred.

According to our test, when the constant-current charging is carried out at two stages of temperatures 0° C. and 20° C. or 40° C. under condition of V1=13V and $V_{S1}$=0.1 (V/min.), the gassing can be detected at respective temperatures 0° C. and 20° C. or 40° C., as similar to the case of estimating the gassing while using the temperature sensor.

Next, when it is judged that the battery 5 has reached the gassing voltage at the charging current $I_N$ (e.g. 10A as $I_1$), then the routine goes to step S207 where the charging current switching unit 26 renews the switching stage n of current into the next switching stage n (n←n+1) change. At sequent step S208, it is executed to change the present charging current In stored in the memory 28 to the new charging current $I_{N+1}$ (e.g. 5A as) at the next stage.

Corresponding to the renewal of the charging current together with the detection of the gassing state, at step S209, the decision value renewing unit 27 operates to renew the present decision value $V_{SN}$ to a new decision value $V_{SN+1}$ previously stored in the memory 28 corresponding to the renewed current $I_{N+1}$ ($V_{SN}$←$V_{SN+1}$).

At step S210, it is executed to judge whether there is still remained at least one switching stage n, in other words, whether or not the present stage n is identical to the last stage previously established in the memory 28. If there is still remained at least one switching stage n, that is, the judgement at step S210 is No, then the routine returns to step S202 and the abovementioned steps are repeated.

On the contrary, if the present stage n is identical to the last stage (Yes), then the routine is ended.

In this way, according to the embodiment, since the decision value for the changing rate of the voltage is changed by the process at step S209 whenever the charging current changes, it is possible to detect the occurrence of gassing state in the battery 5 precisely corresponding to the charging current though the device is equipped with no temperature sensor.

Although the value of charging current is changed simply whenever the gassing state is detected in the above-mentioned embodiment, it may be executed to store the combinations of previously-estimated gassing voltage Vgs and the corresponding switching current I in the memory 28, in the modification. Then, if the gassing state in the battery 5 is detected, the present charging current would be changed into the new charging current corresponding to the terminal voltage of the battery 5 at a point of time when the gassing state is detected.

As mentioned above, according to the invention, when the collected terminal voltage of the battery exceeds the threshold value during charging the battery with the charging current, it is judged that the battery is in course of reaching its gassing state. Under such a situation, if the changing rate in terminal voltage of the battery exceeds the preset decision value, then it is judged that the battery has just reached the gassing state actually.

Thus, since it is possible to detect the gassing state in the battery without using the temperature sensor with high accuracy, the device can be simplified with low price.

Furthermore, by the same reason, it is possible to prevent the battery from being overcharged or charged insufficiently even when it has a tendency of gassing.

Additionally, whenever the charging current is switched to a new one, the decision value is also renewed to a new decision value for the changing rate corresponding to the above new charging current, thereby judging the gassing state. Consequently, it is possible to detect the gassing state generating corresponding to the charging current.

Therefore, even if the battery installed on the hybrid vehicle has a characteristics changed due to the temperature change of the battery caused during the vehicle's traveling, there is no possibility of overcharging or sufficient charging of the battery in spite of the tendency of gassing, without requiring the temperature sensor.

It will be understood by those skilled in the art that the foregoing description is one preferable embodiment of the disclosed battery charge control device. Various changes and modifications may be made to the present invention without departing from the spirit and scope of the invention.

What is claimed is:

1. A battery charge control device for controlling to charge a battery electrically connected with a load, the battery charge control device being constructed so as to charge the battery while lowering a charging current brought from the load in a step manner when the battery's residual capacity drops during the load's operation, the capacity measuring device comprising:

a memory unit for collecting and storing a sequential data of terminal voltage of the battery;

a temporary-gassing detecting unit connected to the memory unit, the temporary-gassing detecting unit generating a signal representing that the battery is in course of reaching its gassing state when the so-collected terminal voltage of the battery exceeds a threshold value during charging the battery with a charging current;

a voltage regulation calculating unit connected to the temporary gassing detecting unit so as to input the signal therefrom, the voltage regulation calculating unit calculating a changing rate of terminal voltage of the battery while the battery is in course of reaching the gassing state; and a gassing detecting unit connected to the voltage regulation calculating unit, for judging that the battery has just reached the gassing state when the calculated changing rate exceeds a preset decision value for the changing rate.

2. A battery charge control device as claimed in claim 1, further comprising:

a charging current switching unit which allows the battery to be charged with a designated charging current corresponding to the beginning of charging and further switches the designated charging current to a next lower charging current as soon as the gassing state of the battery has been detected.

3. A battery charge control device as claimed in claim 2, further comprising:

a decision value renewing unit that, whenever the charging current is switched, changes the preset decision value for the changing rate to a new decision value for the changing rate of the voltage corresponding to the so-switched charging current.

4. A battery charge control device as claimed in claim 3, wherein the decision value is previously stored in another memory unit, corresponding to each of the charging currents and each of the stages of switching.

5. A battery charge control device as claimed in claim 1, wherein the threshold value is identical to one of terminal voltages predetermined on the ground of the temperatures of the battery and the charging currents at the initial stage of the charging.

6. A battery charge control device as claimed in claim 2, wherein the load comprises:

an alternator; and a converter which converts a discharge power from the battery into a designated voltage thereby to transmit it to the alternator and which also converts a regenerative power from the alternator into the charging current of a current value switched by the charging current switching unit thereby to charge the battery.

* * * * *